(12) United States Patent
Hayashi

(10) Patent No.: US 11,189,553 B2
(45) Date of Patent: Nov. 30, 2021

(54) WIRING SUBSTRATE, SEMICONDUCTOR PACKAGE HAVING THE WIRING SUBSTRATE, AND MANUFACTURING METHOD THEREOF

(71) Applicant: J-Devices Corporation, Usuki (JP)

(72) Inventor: Naoki Hayashi, Yokohama (JP)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 12 days.

(21) Appl. No.: 16/661,952

(22) Filed: Oct. 23, 2019

(65) Prior Publication Data

US 2020/0066623 A1    Feb. 27, 2020

Related U.S. Application Data

(62) Division of application No. 15/366,064, filed on Dec. 1, 2016, now abandoned.

(30) Foreign Application Priority Data

Dec. 11, 2015   (JP) .............................. JP2015-241907

(51) Int. Cl.
*H01L 23/498*   (2006.01)
*H01L 23/00*   (2006.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ........... H01L 23/49822; H01L 23/5389; H01L 23/49827; H01L 23/28; H01L 23/49838;
(Continued)

(56) References Cited

U.S. PATENT DOCUMENTS 6,455,783 B1 * 9/2002 Tsukada ................ H01L 21/486
174/256
6,964,887 B2 * 11/2005 Akagawa ............ H01L 23/3121
257/E23.069
(Continued)

FOREIGN PATENT DOCUMENTS

JP    200579462 A    3/2005
JP    2009194381     8/2009
(Continued)

*Primary Examiner* — Bilkis Jahan
*Assistant Examiner* — Victor V Barzykin
(74) *Attorney, Agent, or Firm* — Kevin B. Jackson

(57) ABSTRACT

Provided is a wiring substrate and its manufacturing method in which a thick wiring layer capable of being applied with a large current and a thin wiring layer capable of being subjected to microfabrication coexist in the same layer. The wiring substrate includes: an insulating film located over a first wiring and having a via; and a second wiring over the insulating film. The second wiring has a stacked structure including a first layer and a second layer covering the first layer. The second layer is in direct contact with the first wiring in the via. A thickness of the second layer in a region overlapping with the first layer is different from a thickness of the second layer in the via.

20 Claims, 13 Drawing Sheets

(51) Int. Cl.
*H01L 23/538* (2006.01)
*H01L 21/48* (2006.01)

(52) U.S. Cl.
CPC .... *H01L 23/49827* (2013.01); *H01L 23/5389* (2013.01); *H01L 24/19* (2013.01); *H01L 24/20* (2013.01); *H01L 24/24* (2013.01); *H01L 24/25* (2013.01); *H01L 24/82* (2013.01); *H01L 2224/04105* (2013.01); *H01L 2224/06181* (2013.01); *H01L 2224/24137* (2013.01); *H01L 2224/24246* (2013.01); *H01L 2224/2518* (2013.01); *H01L 2224/32225* (2013.01); *H01L 2224/32245* (2013.01); *H01L 2224/73267* (2013.01); *H01L 2224/82031* (2013.01); *H01L 2224/82039* (2013.01); *H01L 2224/92144* (2013.01); *H01L 2224/92244* (2013.01)

(58) Field of Classification Search
CPC . H01L 2224/04105; H01L 2224/32245; H01L 2224/24137; H01L 2224/92144; H01L 2224/06181; H01L 2224/24246; H01L 2224/2518; H01L 2224/82039; H01L 2224/82031; H01L 2224/73267; H01L 2224/32225; H01L 2224/92244; H01L 24/25; H01L 24/24; H01L 24/82; H01L 24/19; H01L 24/20; H01L 21/4857; H01L 21/486
See application file for complete search history.

(56) References Cited

U.S. PATENT DOCUMENTS

| | | | |
|---|---|---|---|
| 7,485,489 B2 * | 2/2009 | Bjorbell | H01L 23/5385 257/790 |
| 7,507,658 B2 * | 3/2009 | Usui | H01L 21/76814 174/262 |
| 8,114,712 B1 * | 2/2012 | McConnelee | H01L 21/486 438/118 |
| 8,674,492 B2 | 3/2014 | Ota et al. | |
| 9,595,651 B2 * | 3/2017 | Yamashita | C23C 14/34 |
| 2005/0112798 A1 * | 5/2005 | Bjorbell | H01L 24/82 438/106 |
| 2005/0212091 A1 * | 9/2005 | Usui | H01L 21/76814 257/621 |
| 2006/0157832 A1 * | 7/2006 | Ryu | H01L 23/5389 257/678 |
| 2007/0040186 A1 * | 2/2007 | Fillion | H01L 24/82 257/177 |
| 2007/0235810 A1 * | 10/2007 | Delgado | H01L 24/83 257/356 |
| 2008/0305582 A1 * | 12/2008 | Fillion | H01L 25/072 438/118 |
| 2009/0205859 A1 | 8/2009 | Tanaka et al. | |
| 2010/0307807 A1 | 12/2010 | Noda et al. | |
| 2011/0061909 A1 | 3/2011 | Palm et al. | |
| 2011/0108971 A1 * | 5/2011 | Ewe | H01L 24/82 257/686 |
| 2011/0127675 A1 * | 6/2011 | Ewe | H01L 25/0655 257/773 |
| 2011/0198743 A1 * | 8/2011 | Nikitin | H01L 23/13 257/690 |
| 2011/0304043 A1 * | 12/2011 | Wakisaka | H01L 23/562 257/737 |
| 2012/0020026 A1 * | 1/2012 | Oganesian | H01L 21/76877 361/707 |
| 2013/0037917 A1 * | 2/2013 | Xue | H01L 24/94 257/621 |
| 2013/0146991 A1 * | 6/2013 | Otremba | H01L 24/96 257/401 |
| 2014/0159212 A1 * | 6/2014 | Hung | H01L 24/82 257/666 |
| 2015/0014855 A1 * | 1/2015 | Yap | H01L 24/82 257/773 |
| 2015/0028448 A1 * | 1/2015 | Hosseini | H01L 24/24 257/531 |
| 2015/0028487 A1 * | 1/2015 | Meyer-Berg | H01L 24/82 257/773 |
| 2015/0034374 A1 * | 2/2015 | Shimizu | H01L 24/83 174/257 |
| 2015/0054159 A1 * | 2/2015 | Hoegerl | H01L 27/12 257/762 |
| 2015/0243576 A1 | 8/2015 | Miyakoshi et al. | |
| 2017/0207147 A1 * | 7/2017 | Liao | H01L 23/5389 |
| 2018/0151389 A1 * | 5/2018 | Kuo | H01L 24/97 |
| 2019/0006339 A1 * | 1/2019 | Lau | H01L 25/105 |

FOREIGN PATENT DOCUMENTS

| | | |
|---|---|---|
| JP | 2010287879 | 12/2010 |
| JP | 2011523773 | 8/2011 |
| JP | 2013219267 A | 10/2013 |
| JP | 2015005681 | 1/2015 |
| JP | 2015162516 A | 9/2015 |

* cited by examiner

WIRING SUBSTRATE, SEMICONDUCTOR PACKAGE HAVING THE WIRING SUBSTRATE, AND MANUFACTURING METHOD THEREOF

CROSS REFERENCE TO RELATED APPLICATIONS

The present application is a divisional application of co-pending U.S. patent application Ser. No. 15/366,064 filed on Dec. 1, 2016, which is based on and claims the benefit of priority from the prior Japanese Patent Application No. 2015-241907, filed on Dec. 11, 2015, the entire contents of both of which are incorporated herein by reference.

FIELD

The present invention relates to a wiring substrate, a semiconductor package or a stacked-type semiconductor package having the wiring substrate, and a manufacturing method thereof. For example, the present invention relates to a wiring substrate for a power device which is driven with a large current, a semiconductor package or a stacked-type semiconductor package having the wiring substrate, and a manufacturing method thereof.

BACKGROUND

A power semiconductor device is a semiconductor device having a basic function of converting and controlling electric power. A power semiconductor device plays an important role not only in an application to an inverter and a small-sized motor employed in consumer electronics and electronic office equipment but also in management of conversion and control of electric power of an electronic power system in a power plant and a motor-driving system in a train, a vehicle, and so on. Apart from a semiconductor device such as a thin-film transistor utilized in a display device, a power device is driven at a large voltage and applied with a large current. Therefore, as disclosed in Japanese patent application publications No. 2013-219267, 2005-79462, and 2015-162516, a measure against heat generation from wiring due to a large current has been investigated.

SUMMARY

An embodiment of the present invention is a wiring substrate including: an insulating film located over a first wiring and having a via; and a second wiring over the insulating film. The second wiring has a stacked structure including a first layer and a second layer covering the first layer. The second layer is in direct contact with the first wiring in the via. A thickness of the second layer in a region overlapping with the first layer is different from a thickness of the second layer in the via.

In the embodiment, the thickness of the second layer in the via may be larger than the thickness of the second layer in the region overlapping with the first layer. A thickness of the first layer may be larger than the thickness of the second layer in the region overlapping with the first layer. The first layer and the second layer may include copper. The first layer and the second layer may be different in conductivity from each other. A top surface of the insulating film may have a depression between the via and the first layer.

An embodiment of the present invention is a wiring substrate including: an insulating film located over a first wiring and having a via; and a second wiring over the insulating film. The second wiring has a stacked structure including: a second layer in direct contact with the first wiring in the via; and a first layer over and electrically connected to the second layer. A thickness of the second layer in a region overlapping with the insulating film is different from a thickness of the second layer in the via.

In the embodiment, a thickness of the second layer in the via may be larger than the thickness of the second layer in the region overlapping with the insulating film. A thickness of the first layer may be larger than the thickness of the second layer in the region overlapping with the insulating film. The first layer and the second layer may include copper. The first layer and the second layer may be different in conductivity from each other.

An embodiment of the present invention is a semiconductor package including: a semiconductor device having a terminal; an insulating film located over the terminal and having a via; and a wiring over the insulating film. The wiring has a stacked structure including a first layer and a second layer covering the first layer. The second layer is in direct contact with the terminal in the via, and a thickness of the second layer in a region overlapping with the first layer is different from a thickness of the second layer in the via.

In the embodiment, the thickness of the second layer in the via may be larger than the thickness of the second layer in the region overlapping with the first layer. A thickness of the first layer may be larger than the thickness of the second layer in the region overlapping with the first layer. The first layer and the second layer may include copper. The first layer and the second layer may be different in conductivity from each other. A top surface of the insulating film may have a depression between the via and the first layer.

An embodiment of the present invention is a semiconductor package including: a semiconductor device located over a first wiring and having a first terminal and a second terminal; an insulating film located over the second terminal and having a via; and a second wiring over the insulating film. The second wiring has a stacked structure including: a second layer in direct contact with the second terminal in the via; and a first layer located over and electrically connected to the second layer. A thickness of the second layer in a region overlapping with the insulating film is different from a thickness of the second layer in the via.

In the embodiment, the thickness of the second layer in the via may be larger than the thickness of the second layer in the region overlapping with the insulating film. A thickness of the first layer may be larger than the thickness of the second layer in the region overlapping with the insulating film. The first layer and the second layer may include copper. The first layer and the second layer may be different in conductivity from each other.

An embodiment of the present invention is a manufacturing method of a wiring substrate. The manufacturing method includes: forming an insulating film over a first wiring; and forming, over the insulating film, a second wiring having a first layer and a second layer. The formation of the second wiring includes: forming the second layer by bonding a metal plate to the insulating film; exposing the insulating film by forming an opening portion in the second layer; exposing the first wiring by forming a via in the insulating film; and forming the first layer with an electroplating method so that the first layer is located over and in direct contact with the first wiring and the second layer.

In the embodiment, a thickness of the second layer in the via may be larger than a thickness of the second layer in a region overlapping with the first layer. A thickness of the first layer may be larger than the thickness of the second layer in the region overlapping with the first layer. The first layer and the second layer may include copper. The first layer and the second layer may be different in conductivity from each other.

An embodiment of the present invention is a manufacturing method of a wiring substrate. The manufacturing method includes: forming an insulating film over a first wiring; exposing the first wiring by forming a via in the insulating film; and forming, over the insulating film, a second wiring having a first layer and a second layer. The formation of the second wiring includes: forming the second layer with an electroplating method so that the second layer is located over and in contact with the first wiring and the insulating film; and forming the first layer by disposing a metal plate over the second layer so that the first layer is electrically connected to the second layer.

In the embodiment, a thickness of the second layer in the via may be larger than a thickness of the second layer in a region overlapping with the insulating film. A thickness of the first layer may be larger than the thickness of the second layer in the region overlapping with the insulating film. The first layer and the second layer may include copper. The first layer and the second layer may be different in conductivity from each other.

An embodiment of the present invention is a manufacturing method of a semiconductor package. The manufacturing method includes: forming a semiconductor device over a first wiring, the semiconductor device having a first terminal and a second terminal; forming an insulating film over the second terminal; and forming, over the insulating film, a second wiring including a first layer and a second layer. The formation of the second wiring includes: forming the second layer by bonding a metal plate to the insulating film; exposing the insulating film by forming an opening portion in the second layer; exposing the first wiring by forming a via in the insulating film; and forming the first layer with an electroplating method so that the first layer is located over and in direct contact with the first wiring and the second layer.

In the embodiment, a thickness of the second layer in the via may be larger than a thickness of the second layer in a region overlapping with the first layer. A thickness of the first layer may be larger than the thickness of the second layer in the region overlapping with the first layer. The first layer and the second layer may include copper. The first layer and the second layer may be different in conductivity from each other. A top surface of the insulating film may have a depression between the via and the first layer.

An embodiment of the present invention is a manufacturing method of a semiconductor package. The manufacturing method includes: forming a semiconductor device over the first wiring, the semiconductor device having a first terminal and a second terminal; forming an insulating film over the second terminal; and forming, over the insulating film, a second wiring including a first layer and a second layer. The formation of the second wiring includes: forming the second layer with an electroplating method so that the second layer is located over and in contact with the first wiring and the insulating film; and forming the first layer by disposing a metal plate over the second layer so that the first layer is electrically connected to the second layer.

In the embodiment, a thickness of the second layer in the via may be larger than a thickness of the second layer in a region overlapping with the insulating film. A thickness of the first layer may be larger than the thickness of the second layer in the region overlapping with the insulating film. The first layer and the second layer may include copper. The first layer and the second layer may be different in conductivity from each other.

DESCRIPTION OF EMBODIMENTS

Figure 1A:
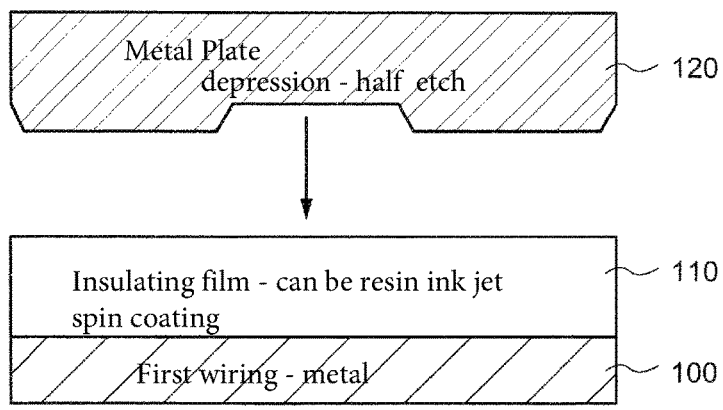
FIG. 1A to FIG. 1E are drawings showing a wiring substrate and its manufacturing method of an embodiment of the present invention.

Hereinafter, the embodiments of the present invention are explained with reference to the drawings. Note that the present invention can be implemented in a variety of modes within the concept of the invention, and the interpretation should not be limited by the disclosure in the embodiments represented below.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, elements which are the same as those explained in the preceding drawings are denoted with the same reference numbers, and their detailed explanation may be omitted appropriately.

It is properly understood that another effect different from that provided by the modes of the embodiments described below is achieved by the present invention if the effect is obvious from the description in the specification or readily conceived by persons ordinarily skilled in the art.

First Embodiment

In the present embodiment, a wiring structure used in a wiring substrate of an embodiment of the present invention and its manufacturing method are explained with reference to FIG. 1A to FIG. 1E. As shown in FIG. 1E, this wiring structure has a wiring (second wiring 140) in which a layer (first layer 125) having a large thickness and capable of being applied with a large current and a layer (second layer 130) having a small thickness and capable of being subjected to microfabrication are stacked and electrically connected to each other. Furthermore, the second layer 130 with a small thickness is also formed in a via. Such a wiring structure can be utilized to establish an electrical connection in stacked wiring layers and wiring substrates.

Specifically, as shown in FIG. 1A, an insulating film 110 is formed over a first wiring 100. The first wiring 100 may be a wiring formed over an insulating substrate such as a glass or plastic substrate or an extraction wiring or a pad mounted on an IC chip or a power device. The first wiring 100 can include a metal such as gold, copper, titanium, molybdenum, and aluminum. An organic material such as an acrylic resin, a polyimide resin, a polyester resin can be used for the insulating film 110, and the insulating film 110 can be formed with a wet-type film-formation method such as a spin-coating method, an ink-jet method, and a printing method. Alternatively, the insulating film 110 may be formed by disposing a film of the aforementioned resin over the first wiring 100 and then pressing the film (lamination processing).

Figure 1B:
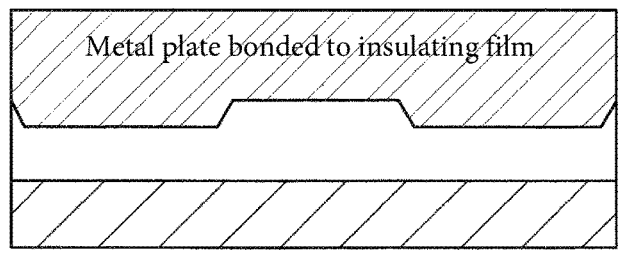
Figure 1C:
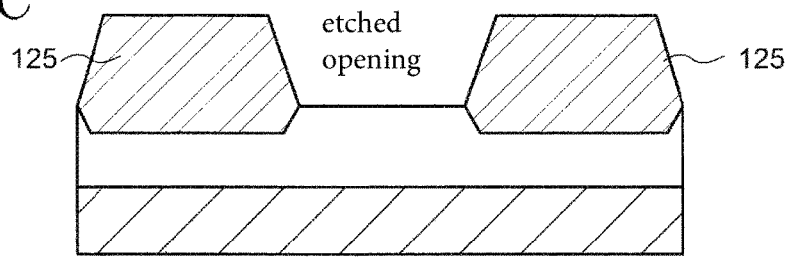

Next, a metal plate 120 is bonded to the insulating film 110 (FIG. 1A and FIG. 1B). Copper, gold, and the like can be used for the metal plate 120, for example. A thickness of this metal plate 120 can be selected from a thickness which allows a current required by the wiring substrate to flow sufficiently. For example, the thickness can be selected from 1 μm to 10 mm and is preferably 100 μm to 300 μm. The metal plate 120 may be bonded by applying pressure from over the insulating film 110 while heating. In FIG. 1A, the metal plate 120 has a depression formed by half etching or the like. The formation of the depression facilitates the formation of an opening portion described below. However, the embodiment is not limited to such a mode, and the metal plate 120 which does not contain the depression and has a flat surface as a whole may be employed.

Next, as shown in FIG. 1O, the opening is formed in the metal plate 120 with a method such as etching to expose the insulating film 110, and a first layer 125 is simultaneously formed. When the metal plate 120 has the depression, the opening can be readily constructed at a position corresponding to the depression by conducting the etching in a region overlapping with the depression (from a side opposite to the depression). The etching may be any method of dry etching and wet etching.

Figure 1D:
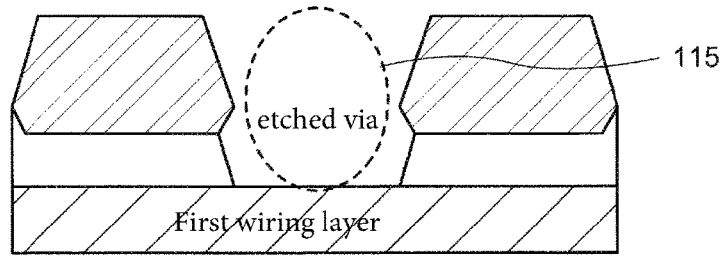
Figure 1E:
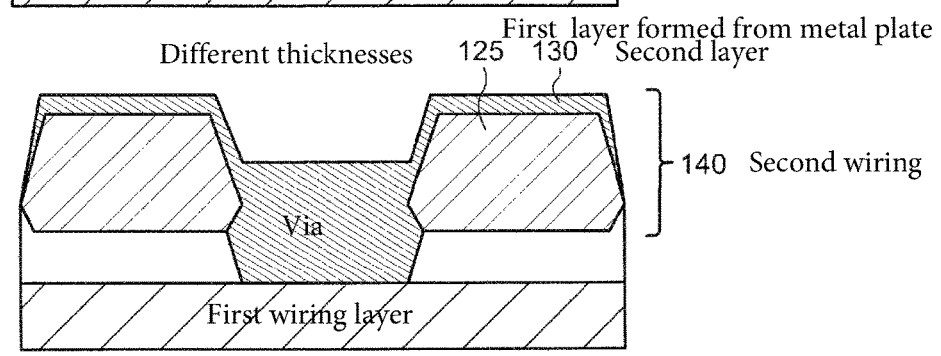

Next, as shown in FIG. 1D, the via 115 is formed by performing laser processing or etching on the insulating film 110 which is exposed by forming the opening portion in the metal plate 120. With this process, a surface of the first wiring 100 is exposed.

After that, as shown in FIG. 1E, the second layer 130 is formed with an electroplating method and the like. As an electroplating method, a copper-electroplating method, a gold-electroplating method, or the like may be employed, by which the second layer 130 including copper or gold is formed. The wiring having the structure in which the first layer 125 and the second layer 130 are stacked is the second wiring 140.

At this time, the second layer 130 is formed so as to cover the first layer 125 and fill the via 115. In other words, a thickness of the second layer 130 in a region overlapping with the first layer 125 is different from a thickness of the second layer 130 in the via 115, and the latter is larger. Note that, when the thickness of the second layer 130 formed in the via 115 is small, the via 115 may be filled with a conductive paste and the like after or before the formation of the second layer 130, for example. As a conductive paste, a gold paste, a silver paste, and the like can be used. After that, a circuit wiring may be formed by processing the second layer 130 with a method such as etching, if necessary.

The thickness of the second layer 130 can be smaller than a thickness of the first layer 125. Specifically, the thickness of the second layer 130 in the region overlapping with the first layer 125 is smaller than the thickness of the first layer 125. Therefore, the formation time of the second layer 130 can be reduced, and the process can be shortened. The thickness of the second layer 130 can be 1 μm to 50 μm or preferably 10 μm to 30 μm.

The first layer 125 and the second layer 130 may be different in electrical resistivity. Alternatively, they may be different in impurity concentration. Alternatively, they may be different in density.

Note that the second layer 130 can be formed by a sputtering method and the like in addition to an electroplating method.

Generally, when a power device is packaged, a wire bonding and a method using a clip electrode are employed for the connection of a power device to an external electrode. Apart from a semiconductor device such as a thin-film transistor utilized in a display, a power device is driven at a high voltage and is applied with a large current. The difficulty of a connection method such as the wire bonding in increasing a thickness of wiring causes a problem of heat generation resulting from a wiring resistance when applied with such a large current.

Additionally, a stacked-type package having a structure in which the whole of the chip is embedded in an insulating resin and wiring layers and insulating layers are stacked into a layered structure has been proposed in order to satisfy the recent requirement such as high integration, cost reduction, and miniaturization of devices. In such a stacked-type package, a via wiring is used to achieve an electrical connection between different layers, a via is filled and a wiring layer is formed simultaneously with an electroplating method and the like. However, the electroplating method is not suitable for the formation of a wiring having a large thickness, and the formation of a thick wiring layer requires an extremely long time, which leads to a decrease in manufacturing efficiency and an increase in manufacturing cost.

Moreover, a thick wiring layer is necessary to suppress heat generation from a wiring because a large current is applied to a power device as described above. Hence, the use of a via wiring formed with an electroplating method and having a relatively small thickness leads to a serious problem of heat generation due to the wiring resistance. On the other hand, when a wiring having a large thickness is formed by using a metal plate and the like, heat generation can be suppressed. However, this method cannot fill a via. Furthermore, it is difficult to perform microfabrication on a wiring having a large thickness, and a wiring structure having a high degree of integration cannot be fabricated. For example, in a module package in which a power device, a control IC, and the like coexist, the smallest design rule in the formation of a thick metal wiring for a power device is larger than a space between electrodes of a control IC. A power device and a control IC cannot be simultaneously patterned by using the same wiring because it is necessary to arrange a wiring in a higher degree of integration in a wiring of a control IC.

However, in the wiring structure according to the present embodiment, a metal layer (the first layer 125 in the present embodiment) formed by using a metal plate and having a large thickness and a metal layer (the second layer 130 in the present embodiment) formed with an electroplating method and the like and having a small thickness are hybridized. Hence, a large current can be applied by using the first layer 125 as a main conduction route, which allows the operation of a power device. On the other hand, the second layer 130 formed with an electroplating method and the like can be utilized in a region in which a large current does not flow but a wiring arrangement in a high degree of integration is required. Therefore, a wiring patterning for a control IC is feasible. With this structure, devices such as a power device and a control IC, which require different design rules, can be arranged in the same layer and can be connected in the same wiring process.

Second Embodiment

In the present embodiment, a wiring structure of a wiring substrate different from that of the First Embodiment is described by using FIG. 2A to FIG. 2D. Description of the structures which are the same as those of the First Embodiment may be omitted.

Figure 2A:
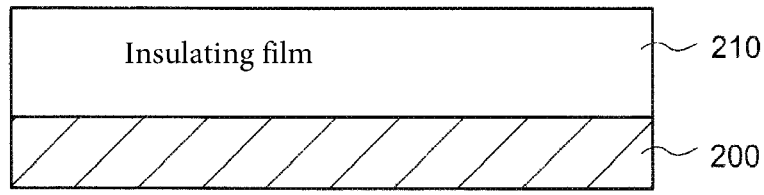
FIG. 2A to FIG. 2D are drawings showing a wiring substrate and its manufacturing method of an embodiment of the present invention.
Figure 2B:
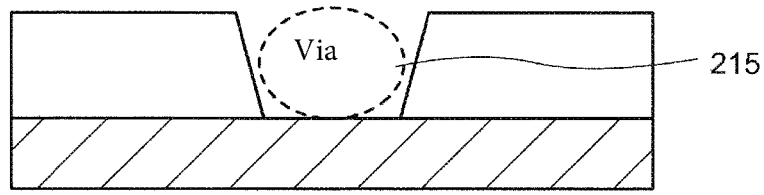
Figure 2C:
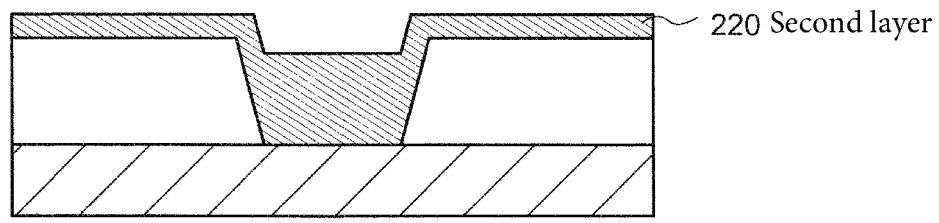
Figure 2D:
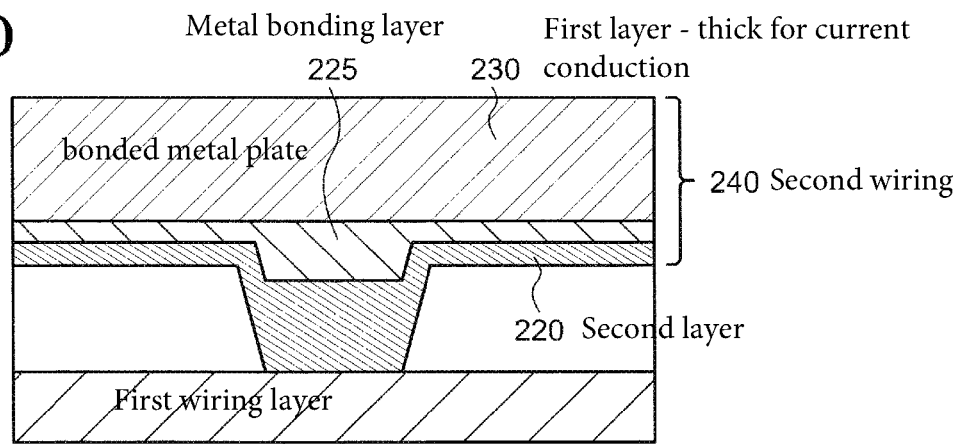

As shown in FIG. 2D, the wiring structure used in the wiring substrate of an embodiment of the present invention has a wiring (second wiring 240) in which a layer (first layer 230) having a large thickness and capable of being applied with a large current and a layer (second layer 220) having a small thickness and capable of being subjected to microfabrication are stacked and electrically connected to each other. Furthermore, the second layer 220 with a small thickness is also formed in a via. Similar to the First Embodiment, such a wiring structure can be utilized to establish an electrical connection in stacked wiring layers and wiring substrates.

First, an insulating film 210 is formed over a first wiring 200, and the insulating film 210 is processed to form the via 215 (FIG. 2A and FIG. 2B). For a material and a film-formation method usable for the insulating film 210, those described in the First Embodiment can be applied.

After that, the second layer 220 is formed over the insulating film 210 with an electroplating method, a sputtering method, and the like (FIG. 2C). As an electroplating method, the method described in the First Embodiment can be applied. At this time, the second layer 220 is formed so as to fill the via 215. In other words, a thickness of the second layer 220 in a region overlapping with the insulating film 210 is different from a thickness of the second layer 220 in the via 215, and the latter is larger. Note that, similar to the First Embodiment, when the thickness of the second layer 220 formed in the via 215 is small, the via 215 may be filled with a conductive paste and the like after or before the formation of the second layer 220, for example. The specific thickness of the second layer 220 is the same as that of the First Embodiment.

Next, as shown in FIG. 2D, a metal plate is bonded over the second layer 220 with a metal bonding layer 225 interposed therebetween to form the first layer 230. Copper, gold, and the like can be used for the metal plate 120, for example. A thickness of this metal plate can be selected from a thickness which allows a current required by the wiring substrate to flow sufficiently and can be selected from the thicknesses described in the First Embodiment. The metal plate may be bonded by applying a pressure from over the metal bonding layer 225 while heating. For the metal bonding layer 225, a metal having a relatively low melting point, such as zinc and tin, or its alloy can be used, and the metal may further include phosphorous at several percent (e.g., 3% to 10% or 5% to 8%). After that, the first layer 230 may be processed into a required shape by using an etching method and the like. The wiring having the structure in which the first layer 230 and the second layer 220 are stacked is the second wiring 240.

A thickness of the second layer 220 may be smaller than a thickness of the first layer 230. Specifically, the thickness of the second layer 220 in a region overlapping with the insulating film 210 is smaller than the thickness of the first layer 230. Therefore, the formation time of the second layer 220 can be reduced, and the process can be shortened.

The second layer 220 and the first layer 230 may be different in electrical resistivity. Alternatively, they may be different in impurity concentration. Alternatively, they may be different in density.

As described in the First Embodiment, in the wiring structure in the present embodiment, a metal layer (the first layer 230 in the present embodiment) formed with a metal plate and having a large thickness and a metal layer (the second layer 220 in the present embodiment) formed with an electroplating method and the like and having a small thickness are hybridized. Hence, a large current can be applied by using the first layer 230 as a main conduction route, which allows the operation of a power device. On the other hand, the second layer 220 formed with an electroplating method and the like can be utilized in a region in which a large current does not flow but a wiring arrangement in a high degree of integration is required. Therefore, wiring patterning for a control IC is feasible. With this structure, devices such as a power device and a control IC, which require different design rules, can be arranged in the same layer and can be connected in the same wiring process.

Third Embodiment

In the present embodiment, a wiring structure of a wiring substrate different from those of the First and Second Embodiments is described by using FIG. 3A to FIG. 4B. Description of the structures which are the same as those of the First and Second Embodiments may be omitted.

Figure 4A:
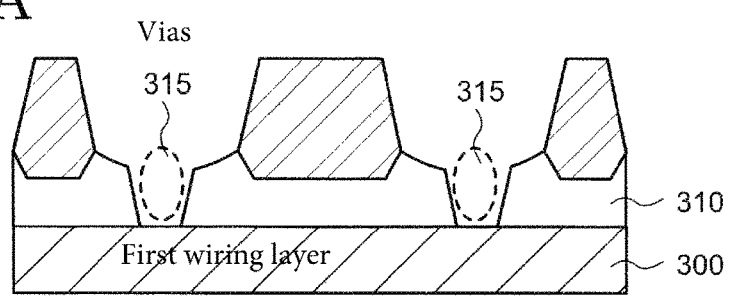
FIG. 4A and FIG. 4B are drawings showing a wiring substrate and its manufacturing method of an embodiment of the present invention.
Figure 4B:
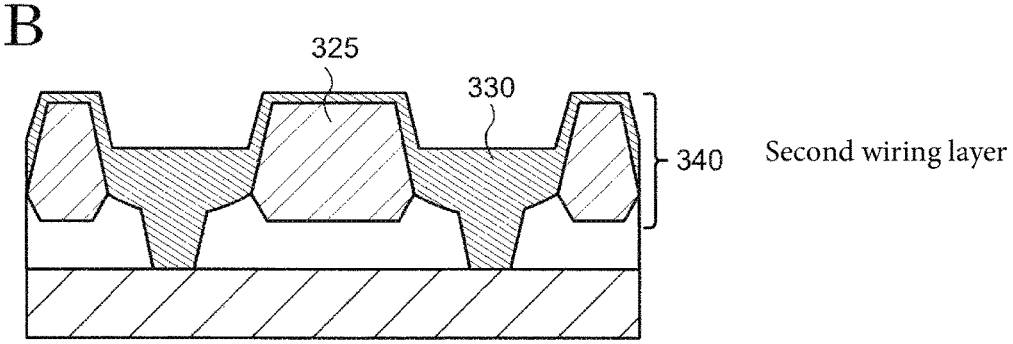

The wiring structure of the wiring substrate of the present embodiment is different from that of the First Embodiment in that an insulating film 310 formed over a first wiring 300 has a depression as shown in FIG. 4B.

Figure 3A:
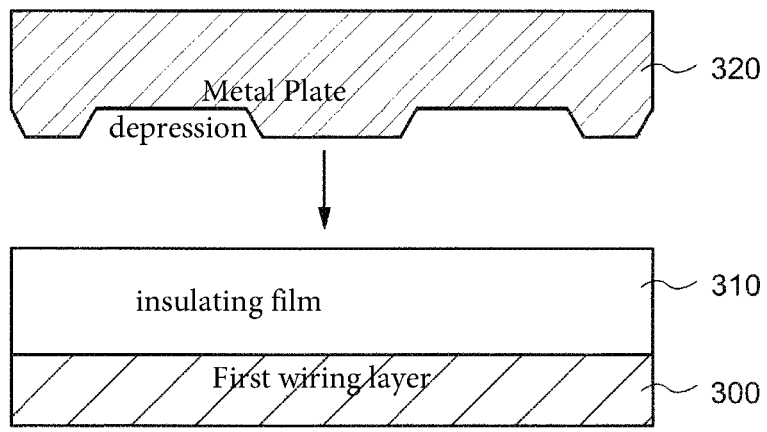
FIG. 3A to FIG. 3D are drawings showing a wiring substrate and its manufacturing method of an embodiment of the present invention.

First, as shown in FIG. 3A, the insulating film 310 is formed over the first wiring 300. For a material and a film-formation method usable for the first wiring 300 and the insulating film 310, those described in the First Embodiment can be used.

Figure 3B:
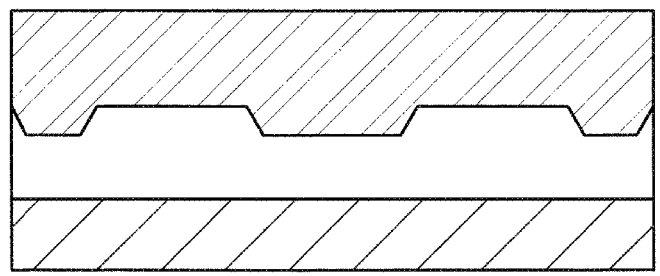

Next, a metal plate 320 is bonded to the insulating film 310 (FIG. 3A and FIG. 3B). A material and a thickness of the metal plate 320 can be selected from the ranges described in the First Embodiment. Moreover, as a bonding method of the metal plate 320, the method described in the First Embodiment can be employed. In FIG. 3A, the metal plate 320 has a plurality of depressions formed by half etching and the like. The formation of the depressions facilitates the formation of openings described below in the metal plate 320. However, the present embodiment is not limited to such a mode, and the metal plate 320 which does not contain the depressions and has a flat surface as a whole may be employed.

Figure 3C:
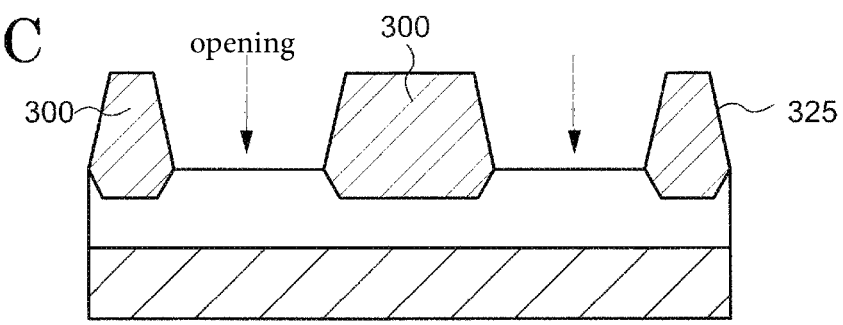

Next, as shown in FIG. 3C, the openings are formed in the metal plate 320 with etching or the like to expose the insulating film 310, and a first layer 325 is formed simultaneously. When the metal plate 320 has the depressions, the openings can be readily constructed at the positions corresponding to the depressions by conducting the etching in the regions overlapping with the depressions (from a side opposite to the depressions).

Figure 3D:
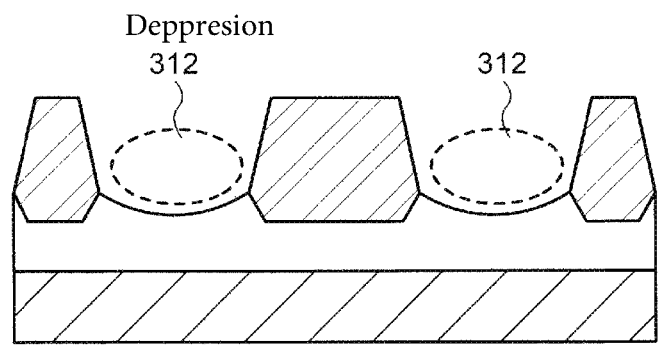

Next, as indicated by the arrow in FIG. 3C, the depressions 312 are formed at a surface of the insulating film 310 by applying physical force or performing etching and the like on the exposed insulating film 310 (FIG. 3D). The depressions 312 may be formed by laser irradiation. The formation of such depressions 312 facilitates the formation of vias in the insulating film 310.

Next, as shown in FIG. 4A, the vias 315 are formed by applying a method such as an etching method, laser irradiation, or the like on the insulating film 310 in which the depressions 312 are formed. By this process, a surface of the first wiring 300 is exposed.

Next, as shown in FIG. 4B, a second layer 330 is formed with an electroplating method and the like. As the electroplating method, the method described in the First Embodiment may be employed. The wiring having the structure in which the first layer 325 and the second layer 330 are stacked is a second wiring 340.

At this time, the second layer 330 is formed so as to cover the first layer 325 and fill the vias 315. In other words, a thickness of the second layer 330 in a region overlapping with the first layer 325 is different from a thickness of the second layer 330 in the vias 315, and the latter is larger. Note that, when the thickness of the second layer 330 formed in the vias 315 is small, the vias 315 may be filled with a conductive paste and the like after or before the formation of the second layer 330, for example. After that, a circuit wiring may be formed by processing the second layer 330 with a method such as etching, if necessary.

The thickness of the second layer 330 can be smaller than a thickness of the first layer 325. Specifically, the thickness of the second layer 330 in the region overlapping with the first layer 325 is smaller than the thickness of the first layer 325. Therefore, the formation time of the second layer 330 can be reduced, and the process can be shortened. The thickness of the first layer 325 and the second layer 330 may be selected from those described in the First Embodiment.

The first layer 325 and the second layer 330 may be different in electrical resistivity. Alternatively, they may be different in impurity concentration. Alternatively, they may be different in density.

Note that the second layer 330 may be formed with a sputtering method and the like in addition to an electroplating method.

As described in the First Embodiment, in the wiring structure in the present embodiment, a metal layer (the first layer 325 in the present embodiment) formed with a metal plate and having a large thickness and a metal layer (the second layer 330 in the present embodiment) formed with an electroplating method and the like and having a small thickness are hybridized. Hence, a large current can be applied by using the first layer 325 as a main conduction route, which allows the operation of a power device. On the other hand, the second layer 330 formed with an electroplating method and the like can be utilized in a region in which a large current does not flow but a wiring arrangement in a high degree of integration is required. Therefore, wiring patterning for a control IC is feasible. With this structure, devices such as a power device and a control IC, which require different design rules, can be arranged in the same layer and can be connected in the same wiring process.

Fourth Embodiment

In the present embodiment, an example in which the wiring substrate having the wiring structure described in the First Embodiment is applied to a semiconductor package is described by using FIG. 5A to FIG. 7C. Description of the structures which are the same as those of the First Embodiment may be omitted.

Figure 6A:
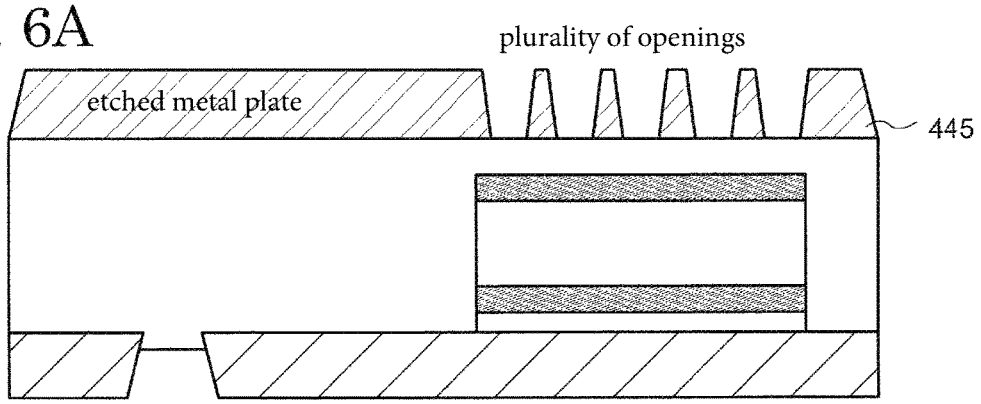
FIG. 6A to FIG. 6C are drawings showing a semiconductor package and its manufacturing method of an embodiment of the present invention.
Figure 6B:
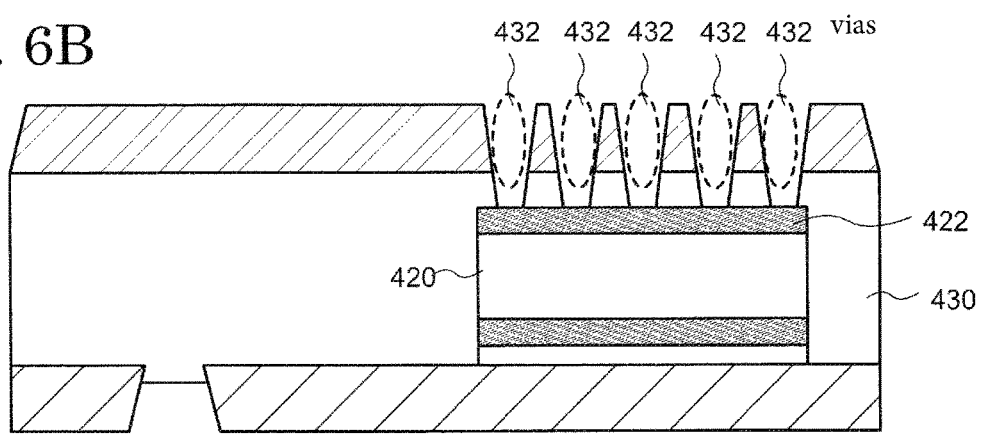
Figure 6C:
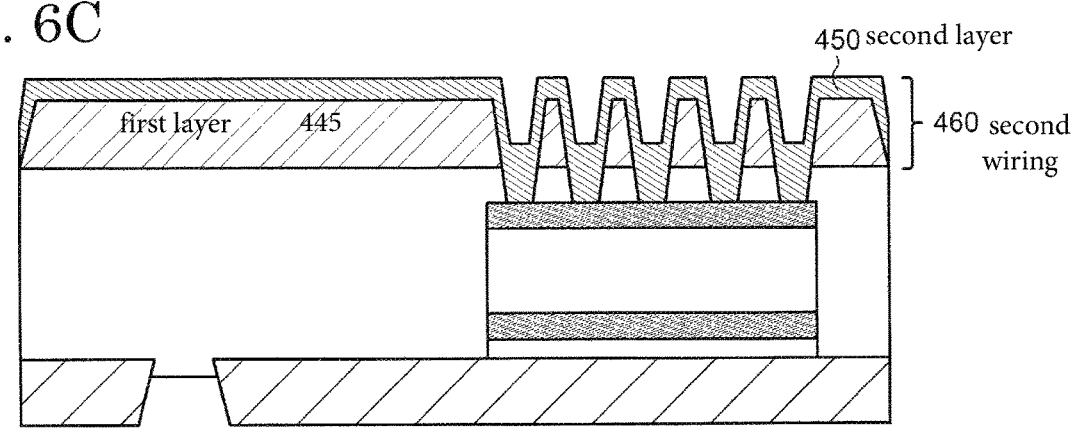
Figure 7A:
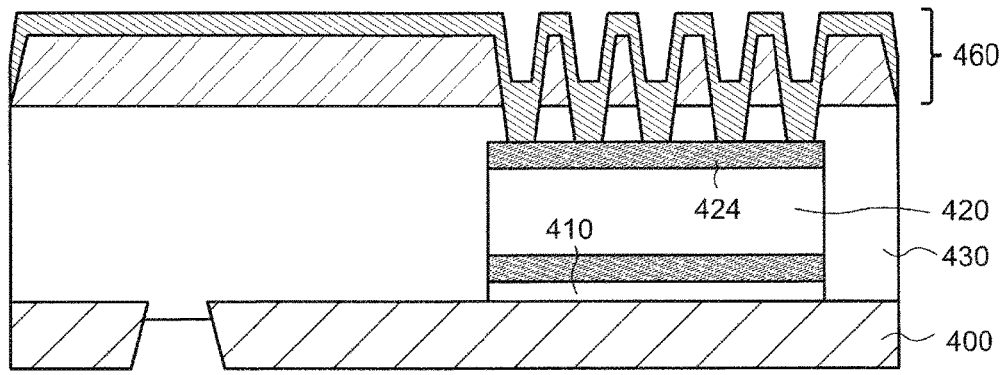
FIG. 7A to FIG. 7C are drawings showing a semiconductor package and its manufacturing method of an embodiment of the present invention.
Figure 7B:
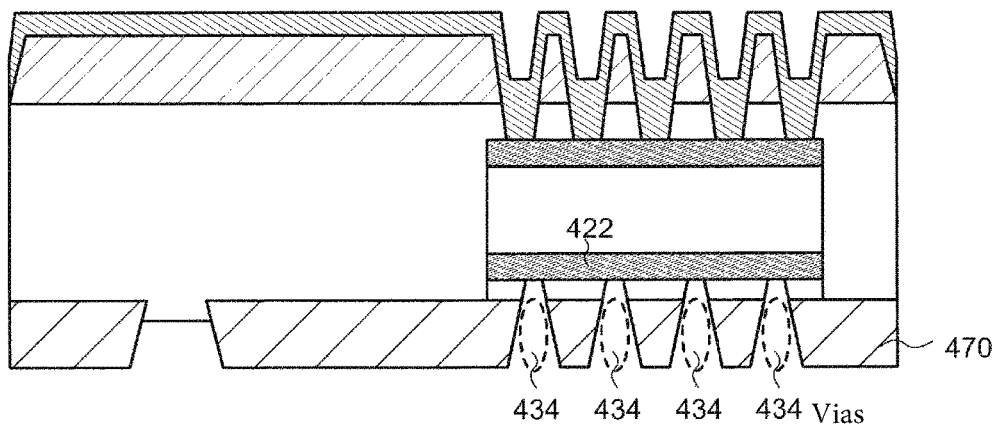
Figure 7C:
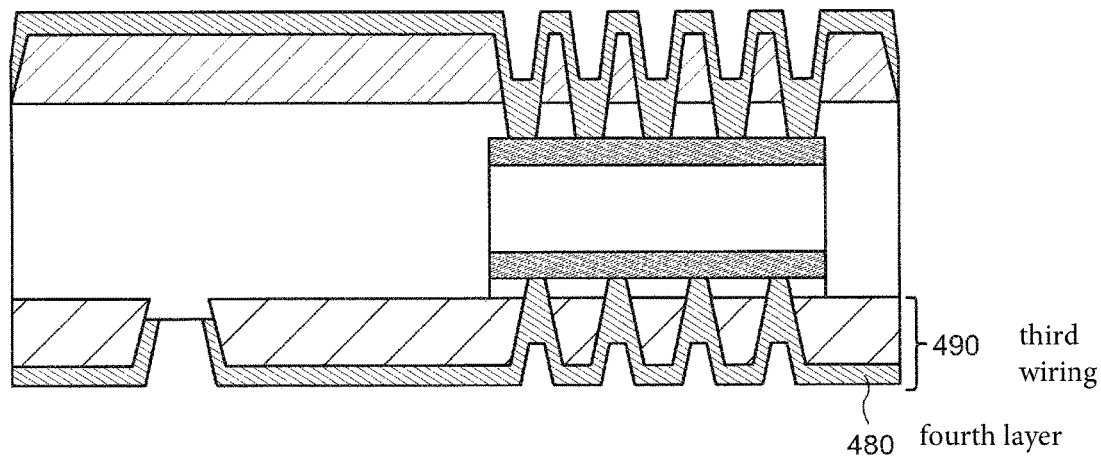

As shown in FIG. 6C and FIG. 7C, the wiring substrate of the present embodiment possesses a wiring at least over or under a semiconductor device such as a power device. Additionally, the wiring has a structure in which a layer with a large thickness and a layer with a small thickness are hybridized. The former can be used as a flow route of a large current, whereas the latter can be used in order to form a wiring having a high degree of integration.

A manufacturing method of the semiconductor package of the present embodiment is shown in FIG. 5A to FIG. 7C. First, the semiconductor device 420 such as a power device is bonded over a first wiring 400 with a bonding layer 410 interposed therebetween. A first terminal 422 and a second terminal 424 are arranged as an extraction wiring under and over the semiconductor device 420. The first wiring 400 may be a wiring mounted on an insulating substrate, a wiring formed in a layered form, or a wiring for connecting this wiring. Alternatively, the first wiring 400 may be an extraction wiring or a pad formed on an IC chip or a power device. An organic adhesion material such as an acrylic-based adhesive can be used for the bonding layer 410. Alternatively, the bonding layer 410 may be a metal bonding layer including a metal with a relatively low melting point, such as zinc and tin, or its alloy.

Next, an insulating film 430 is formed so as to cover the first wiring 400 and the semiconductor device 420. As a material and a formation method of the insulating film 430, those described in the First Embodiment may be used. The insulating film 430 protects the semiconductor device 420 and prevents entrance of impurities such as water and ions from outside.

Figure 5A:
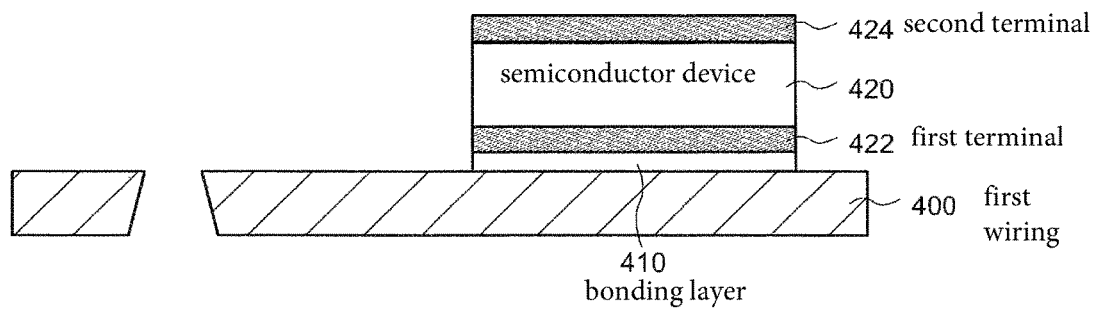
FIG. 5A to FIG. 5C are drawings showing a semiconductor package and its manufacturing method of an embodiment of the present invention.
Figure 5B:
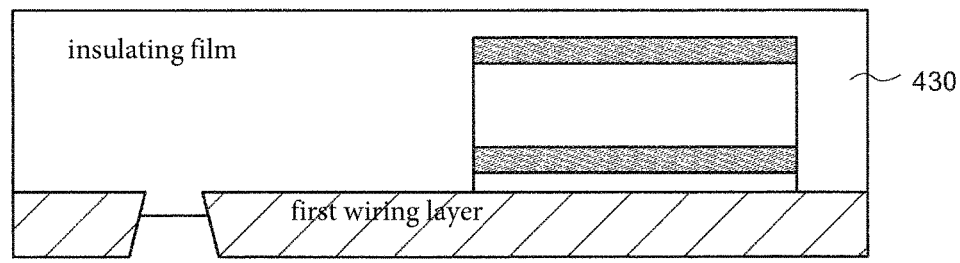
Figure 5C:
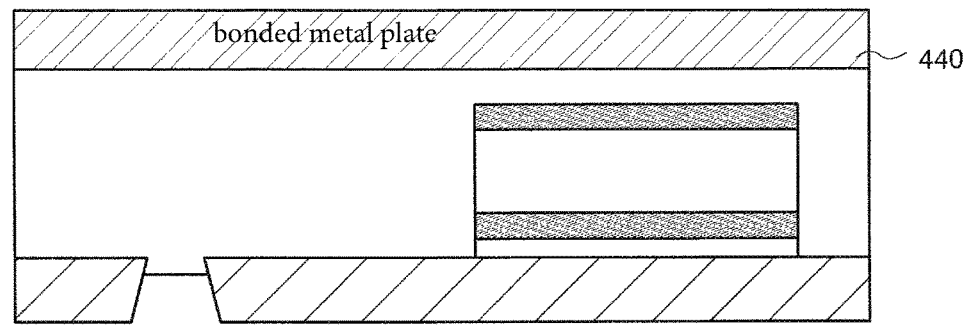

Next, as shown in FIG. 5C, a metal plate 440 is bonded over the insulating film 430. As a material and a bonding method of the metal plate 440, those shown in the First Embodiment may also be employed. A depression may be formed at a surface which contacts with the insulating film 430 by performing half etching on the metal plate 440 in advance.

Next, a first layer 445 is formed by processing the metal plate 440 with etching and the like (FIG. 6A). Here, a plurality of opening portions is formed in the metal plate 440, and the insulating film 430 is exposed.

Next, as shown in FIG. 6B, etching or laser irradiation is conducted onthe insulating film 430 over the second terminal 422 of the semiconductor device 420, by which the region exposed in the openings is removed and the second terminal 422 is exposed. By this process, a plurality of vias 432 is formed over the second terminal 422. Note that, before processing the insulating film 430, a depression may be formed by applying physical force or performing laser irradiation on its surface.

After that, as shown in FIG. 6C, a second layer 450 is formed with an electroplating method or the like so as to cover the first layer 445 and fill the vias 432. As the electroplating method, the method shown in the First Embodiment may be applied. The wiring having the structure in which the first layer 445 and the second layer 450 are stacked is a second wiring 460. The features regarding the thickness of the first layer 445 and the second layer 450 are the same as those in the First Embodiment.

Through the aforementioned process, a wiring having a stacked structure (first layer 445 and second layer 450) can be formed over the semiconductor device 420. A large current for driving the semiconductor device 420 is mainly supplied through the first layer 445, whereas a wiring with a high degree of integration is formed by using the second layer 450.

FIG. 7A to FIG. 7C show a method for additionally forming a wiring having a stacked structure under the semiconductor device 420. FIG. 7A shows a step in which the stacked wiring (second wiring 460) is formed on a top side of the semiconductor device 420. First, the first terminal 422 is exposed by forming vias 434 in the first wiring 400 and the bonding layer 410 with etching or the like (FIG. 7B). Here, a plurality of vias 434 is formed. By this process, a third layer 470 is formed. The formation of the vias 434 may be carried out in one step by simultaneously processing the first wiring 400 and the bonding layer 410. Alternatively, openings may be initially formed in the first wiring 400 with etching or the like, and then the vias 434 may be formed by processing the bonding layer 410 under different conditions or with a different method in the next step.

After that, a fourth layer 480 is formed with an electroplating method and the like so as to cover the third layer 470 and fill the vias 434. The wiring having the structure in which the third layer 470 and the fourth layer 480 are stacked is a third wiring 490. The features regarding the thickness of the first wiring 400 and the fourth layer 480 are the same as those of the First Embodiment.

Through the aforementioned process, a wiring having a stacked structure (third layer 470 and fourth layer 480) can be formed under the semiconductor device 420. A large current for driving the semiconductor device 420 is mainly supplied through the third layer 470, whereas a wiring with a high degree of integration is formed by using the fourth layer 480. The use of the manufacturing method of the present embodiment allows the production of a semiconductor package in which a wiring for a large current and a wiring for a small current coexist in the same layer.

Fifth Embodiment

In the present embodiment, an example in which the wiring substrate having the wiring structures described in the First and Second Embodiments is applied to a semiconductor package is described by using FIG. 8A to FIG. 10B. Note that description of the structures which are the same as those of the First and Second Embodiments may be omitted.

Figure 9A:
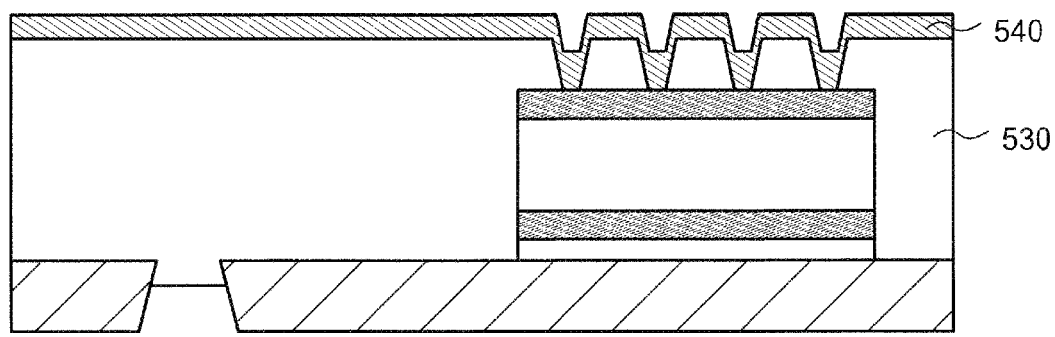
FIG. 9A and FIG. 9B are drawings showing a semiconductor package and its manufacturing method of an embodiment of the present invention.
Figure 9B:
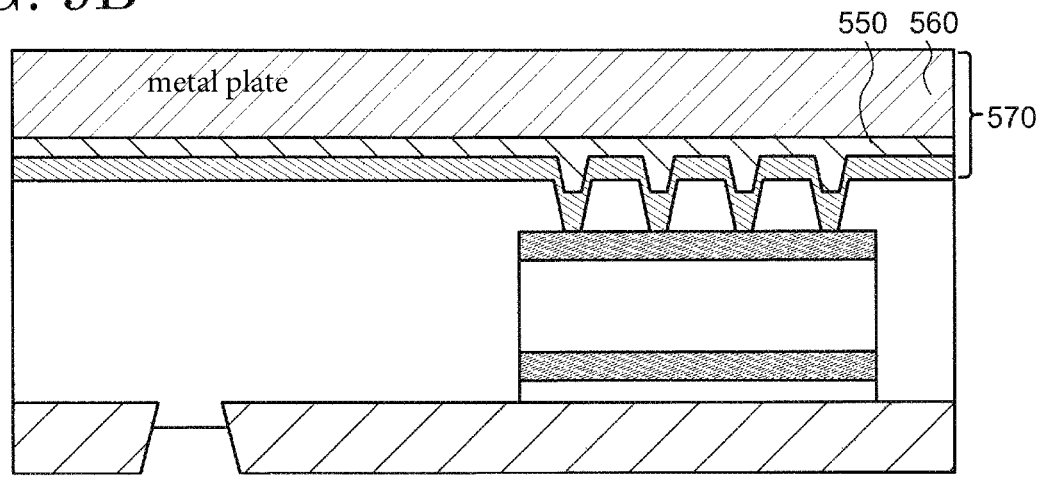
Figure 10A:
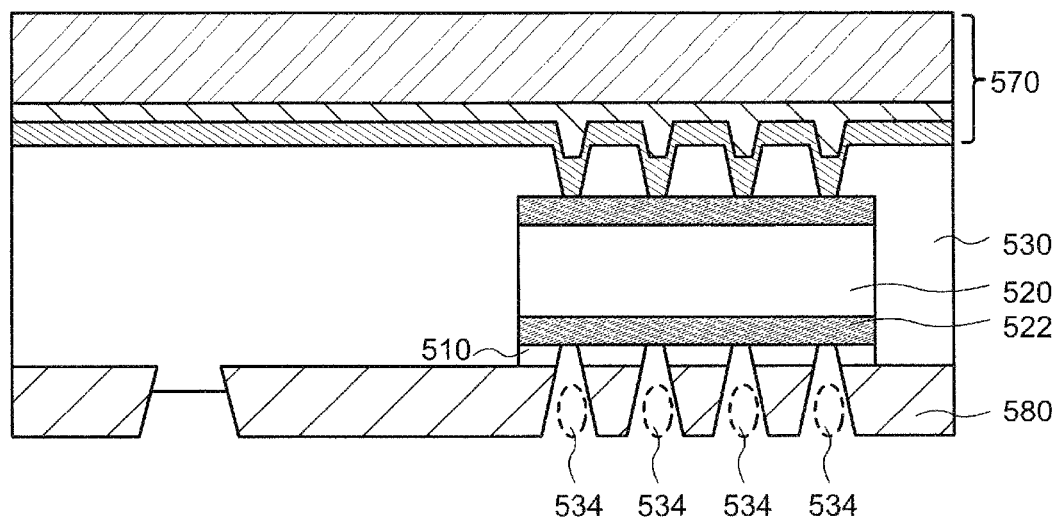
FIG. 10A and FIG. 10B are drawings showing a semiconductor package and its manufacturing method of an embodiment of the present invention.
Figure 10B:
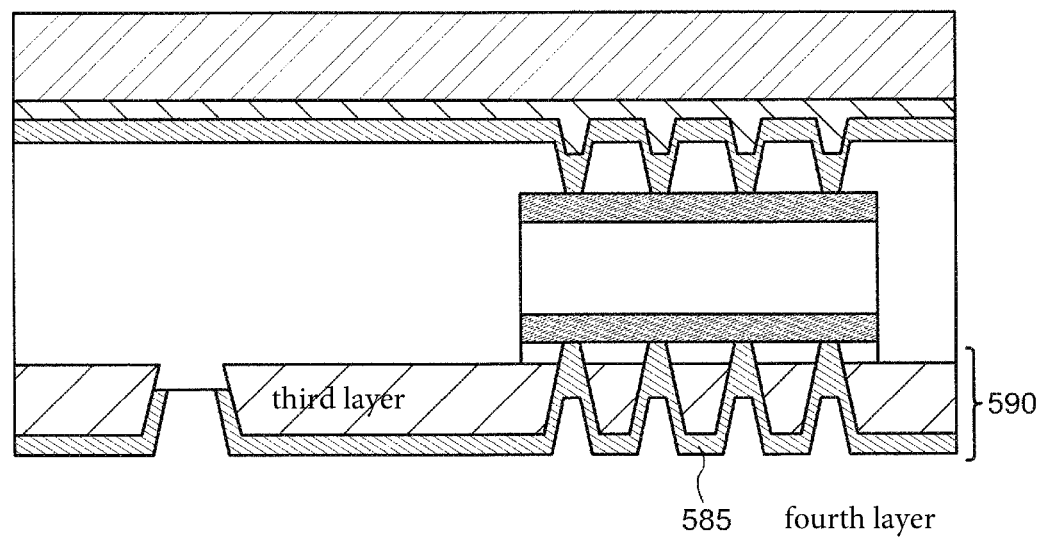

As shown in FIG. 9B and FIG. 10B, the wiring substrate of the present embodiment possesses a wiring at least over or under a semiconductor device such as a power device. Additionally, the wiring has a structure in which a layer with a large thickness and a layer with a small thickness are hybridized. The former can be used as a flow route of a large current, whereas the latter can be used in order to form a wiring having a high degree of integration.

Figure 8A:
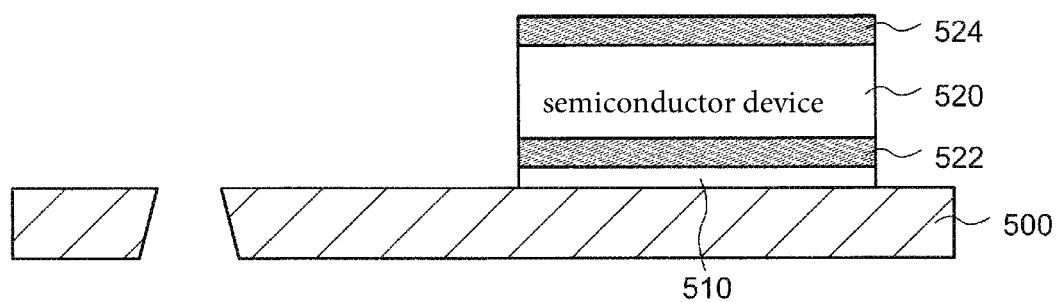
FIG. 8A to FIG. 8C are drawings showing a semiconductor package and its manufacturing method of an embodiment of the present invention.

A manufacturing method of the semiconductor package of the present embodiment is shown in FIG. 8A to FIG. 10B. First, a semiconductor device 520 such as a power device is bonded over a first wiring 500 with a bonding layer 510 interposed therebetween (FIG. 8A). A first terminal 522 and a second terminal 524 are arranged as an extraction wiring under and over the semiconductor device 520. The first wiring 500 may be a wiring mounted on an insulating substrate, a wiring formed in a layered form, or a wiring for connecting this wiring. Alternatively, the first wiring 500 may be an extraction wiring or a pad formed on an IC chip or a power device. An organic adhesion material such as an acrylic-based adhesive can be used for the bonding layer 510. Alternatively, the bonding layer 510 may be a metal bonding layer including a metal with a relatively low melting point, such as zinc and tin, or its alloy.

Figure 8B:
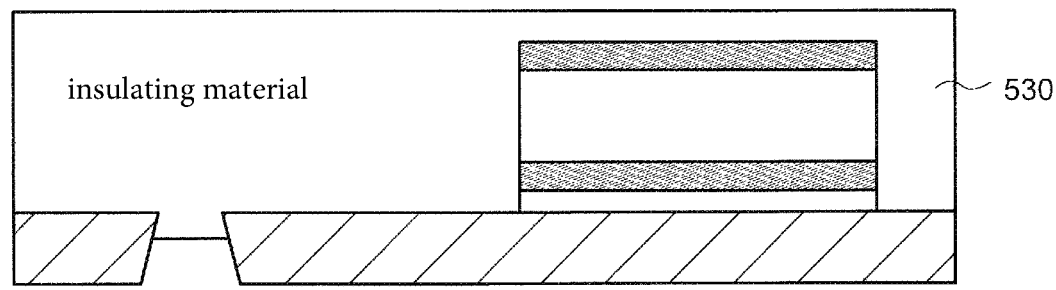

Next, an insulating film 530 is formed so as to cover the first wiring 500 and the semiconductor device 520 (FIG. 8B). As a material and a formation method of the insulating film 530, those described in the First Embodiment may be used. The insulating film 530 protects the semiconductor device 520 and prevents entrance of impurities such as water and ions from outside.

Figure 8C:
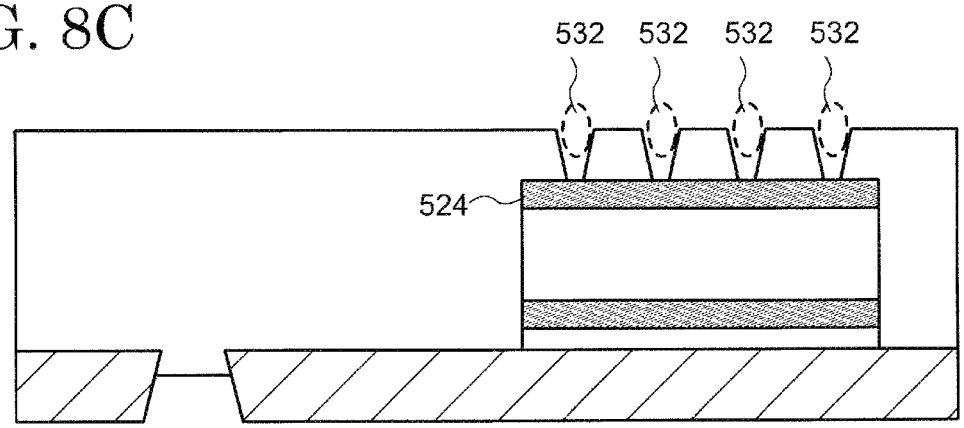

Next, as shown in FIG. 8C, vias 532 are formed in the insulating film 530 to expose the second terminal 524. Here, a plurality of vias 532 is formed. The formation of the vias 532 can be carried out with etching, laser irradiation, or the like.

After that, a second layer 540 is formed over the insulating film 530 so as to fill the vias 532 with an electroplating method, a sputtering method, or the like described in the First Embodiment (FIG. 9A).

Next, as shown in FIG. 9B, a metal plate is bonded over the second layer 540 with a metal bonding layer 550 interposed therebetween to form a first layer 560. As the metal plate and the metal bonding layer 550, those shown in the Second Embodiment may be used, and the bonding may be performed with the same method as that of the Second Embodiment. The features regarding the first layer 560 and the second layer 540 are the same as that of the Second Embodiment. After that, the first layer 560 may be processed into a required shape by using an etching method and the like. The wiring having the structure in which the first layer 560 and the second layer 540 are stacked is a second wiring 570.

Through the aforementioned process, a wiring having a stacked structure (first layer 560 and second layer 540) can be formed over the semiconductor device 520. A large current for driving the semiconductor device 520 is mainly supplied through the first layer 560, whereas a wiring with a high integration degree is formed by using the second layer 540.

FIG. 10A and FIG. 10B show a method for additionally forming a wiring having the stacked structure shown in the First Embodiment under the semiconductor device 520. First, the first terminal 522 is exposed by forming vias 534 in the first wiring 500 and the bonding layer 510 with etching or the like (FIG. 10A). Here, a plurality of vias 534 is formed. By this process, a third layer 580 is formed. The formation of the vias 534 may be carried out in one step by simultaneously processing the first wiring 500 and the bonding layer 510. Alternatively, openings may be initially formed in the first wiring 500 with etching or the like, and then the vias 534 may be formed by processing the bonding layer 510 under different conditions or with a different method in the next step.

After that, a fourth layer 585 is formed with an electroplating method and the like so as to cover the third layer 580 and fill the vias 534. The wiring having the structure in which the third layer 580 and the fourth layer 585 are stacked is a third wiring 590. The features regarding the thickness of the third layer 580 and the fourth layer 585 are the same as those in the First Embodiment. After that, the fourth layer 585 may be processed to form a circuit wiring having a high degree of integration, for example.

Through the aforementioned process, a wiring having a stacked structure (third layer 580 and fourth layer 585) can be formed under the semiconductor device 520. A large current for driving the semiconductor device 520 is mainly supplied through the third layer 580, whereas a wiring with a high degree of integration is formed by using the fourth layer 585. The use of the manufacturing method of the present embodiment allows the production of a semiconductor package in which a wiring for a large current and a wiring for a small current coexist in the same layer.

Sixth Embodiment

Figure 11:
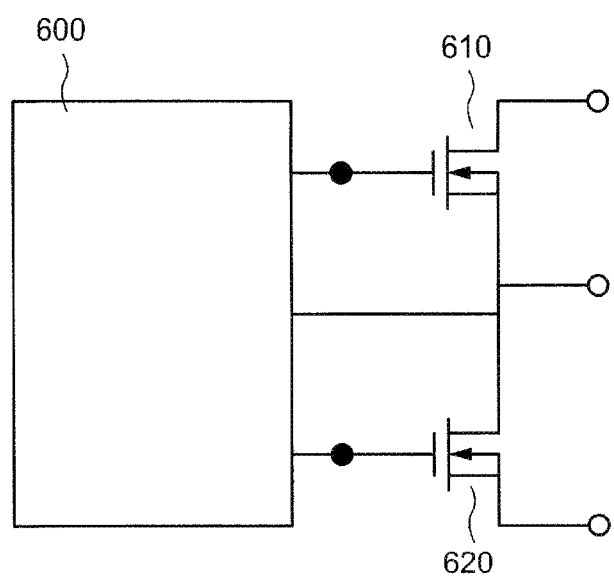
FIG. 11 is a circuit diagram of a semiconductor package of an embodiment of the present invention.
Figure 12:
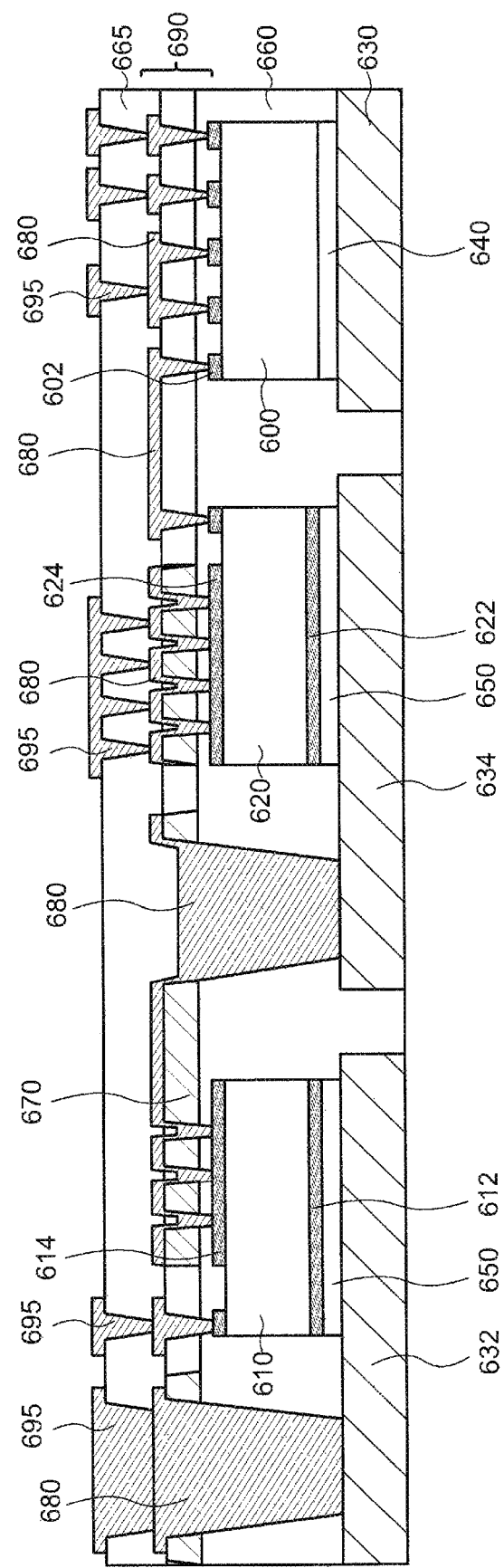
FIG. 12 is a cross-sectional view of a semiconductor package of an embodiment of the present invention.

In the present embodiment, a semiconductor package in which a wiring for a large current and a wiring for a small current coexist in the same layer and in which a semiconductor device driven with small electric power and a power device applied with a large current coexist in the same layer is explained by using FIG. 11 and FIG. 12.

FIG. 11 is a circuit diagram of the semiconductor package shown in the present embodiment. Reference numeral 600 is a control IC which controls two power devices 610 and 620. The power devices 610 and 620 have a structure of a transistor, and drains thereof are electrically connected to each other. The control IC 600 is a device driven with a relatively small current, while the power devices 610 and 620 are each a device driven with a large current. Therefore, a wiring connected to the control IC 600 is preferred to be a wiring with a small thickness, whereas a wiring with a large thickness is connected to the power devices 610 and 620.

FIG. 12 is an example of a cross-sectional structure of the wiring substrate shown in FIG. 11. The wiring substrate of the present embodiment has first wirings 630, 632, and 634. The control IC 600 is fixed over the first wiring 630 with a bonding layer 640 interposed therebetween. As the bonding layer 640, that shown in the Fourth Embodiment can be used.

A first terminal 612 and a second terminal 614 are provided to the power device 610, and a first terminal 622 and a second terminal 624 are provided to the power device 620 similarly. The power device 610 is fixed over the first wiring 632 by using, for example, a metal bonding layer 650 and electrically connected to the first wiring 632. Similarly, the power device 620 is fixed over the first wiring 634 by using, for example, a metal bonding layer 650 and electrically connected to the first wiring 634.

An insulating film 660 is formed so as to embed the control IC 600 and the power devices 610 and 620, and the insulating film 660 covers terminals 602 of the control IC 600 and the second terminals 614 and 624 of the power devices 610 and 620. The insulating film 660 can have the structure which is the same as that of the insulating film 110 of the First Embodiment.

A first layer 670 having a large thickness is arranged over the power devices 610 and 620 with the insulating film 660 interposed therebetween. The first layer 670 can have the structure which is the same as that of the first layer 125 of the First Embodiment and can be formed with the method which is the same as that of the first layer 125 of the First embodiment. This first layer 670 functions as a main wiring route for supplying a large current to the power devices 610 and 620.

Vias are formed in the first layer 670 and the insulating film 660 to expose the terminals 602 of the control IC 602, the second terminals 614 and 624 of the power devices 610 and 620, and the first wirings 632 and 634, and a second layer 680 is formed over the first layer 670 with an electroplating method and the like to fill the vias. The second layer 680 can have the structure which is the same as that of the second layer 130 of the First Embodiment and can be formed with the method which is the same as that of the second layer 130 of the First Embodiment. Note that, the second layer 680 is further subjected to patterning in FIG. 12 and utilized to supply signals from the control IC, for example. The wiring in which the first layer 670 and the second layer 680 are stacked is a second wiring 690.

An upper wiring 695 is further stacked over the second layer 680 with an insulating film 665 interposed therebetween. This upper wiring 695 can be formed with the method which is the same as that of the second layer 680.

As described above, the semiconductor package of the present embodiment has a structure in which a wiring for a large current (first layer 670) and a wiring for a small current (second layer 680) coexist in the same layer. With this structure, devices such as a power device and a control IC, which require different design rules, can be arranged in the same layer and connected to each other in the same wiring process.

Seventh Embodiment

Figure 13:
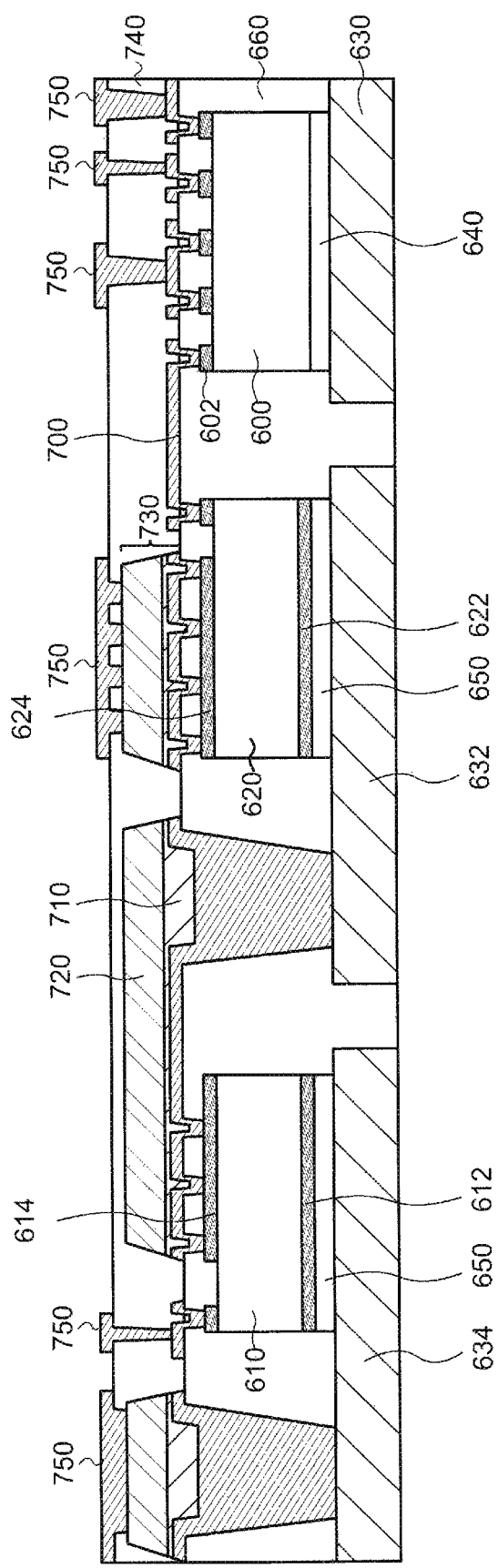
FIG. 13 is a cross-sectional view of a semiconductor package of an embodiment of the present invention.

In the present embodiment, a semiconductor package in which a wiring for a large current and a wiring for a small current coexist in the same layer and in which a semiconductor device driven with small electric power and a power device applied with a large current coexist in the same layer is explained by using FIG. 11 and FIG. 13. Note that the present embodiment is different from the Sixth Embodiment in structure of the second wiring. The structures which are different from those of the Sixth Embodiment are mainly explained and an explanation of the same structures may be omitted.

FIG. 11 is a circuit diagram of the semiconductor package shown in the present embodiment and the same as that of the Sixth Embodiment. FIG. 13 is an example of a cross-sectional structure of the wiring substrate shown in FIG. 11. In the insulating film 660 are formed vias which reach the terminals 602 of the control IC, the second terminal 614 of the power device 610, the second terminal 624 of the power device 620, and the first wirings 632 and 634, and a second layer 700 is formed so as to fill these vias. The second layer 700 can be formed by using the material and the method which are the same as those of the second layer 220 of the Second Embodiment.

A first layer 720 having a large thickness is disposed over a region of the second layer 700, which overlaps with the power devices 610 and 620, with a metal bonding layer 710 interposed therebetween. The first layer 720 can have the same structure as that of the first layer 125 of the First Embodiment and can be formed with the method which is the same as that of the first layer 125 of the First Embodiment. The stack of the first layer 720 and the second layer 700 is a second wiring 730 and corresponds to the second wiring 240 of the Second Embodiment. The first layer 720 functions as a main wiring route for supplying a large current to the power devices 610 and 620, whereas the second layer 700 is used for fabricating a wiring with a high degree of integration and for supplying signals from the control IC, for example.

An upper wiring 750 is further stacked over the first layer 720 with the insulating film 740 interposed therebetween. This upper wiring 750 can be formed with the method which is the same as that of the second layer 700.

As described above, the wiring substrate of the present embodiment has a structure in which a wiring for a large current (first layer 720) and a wiring for a small current (second layer 700) coexist in the same layer. With this structure, devices such as a power device and a control IC, which require different design rules, can be arranged in the same layer and connected to each other in the same wiring process.

What is claimed is:

1. A semiconductor package comprising:
   a first wiring;
   a semiconductor device comprising a device top side, a device bottom side opposite to the device top side, a first terminal adjacent to the device bottom side and coupled to the first wiring, a second terminal adjacent to the device top side, and a third terminal adjacent to the device top side laterally separated from the second terminal;
   an insulating film over the second terminal and the third terminal;
   a first layer over the insulating film and over the second terminal but not over the third terminal;
   an opening in the first layer over the second terminal;
   a first via that extends through the insulating film to expose at least a portion of the third terminal;
   a second via that extends from the opening through the insulating film to expose at least a portion of the second terminal; and
   a second layer having a first portion within the first via and having a second portion over the first layer and within the opening and the second via, wherein:
   the first portion of the second layer comprises a first wiring route;
   the second portion of the second layer and the first layer comprises a second wiring route; and
   the first wiring route is devoid of the first layer.

2. The semiconductor package according to claim 1, wherein:
   the second portion of the second layer overlaps an upper surface of the first layer;
   the second portion of the second layer has a first thickness overlapping the upper surface of the first layer and a second thickness in the second via; and
   the first thickness is less than the second thickness.

3. The semiconductor package wiring substrate according to claim 2, wherein
   the first layer has a third thickness; and
   the first thickness is less than the third thickness.

4. The semiconductor package according to claim 1, wherein:
   the first layer comprises a patterned metal plate.

5. The semiconductor package according to claim 1, wherein:
   a top surface of the insulating film has a depressed portion between the second via and the first layer.

6. The semiconductor package according to claim 1, wherein:
   the opening has a first width; and
   the second via has a second width different than the first width.

7. The semiconductor package according to claim 1, wherein:
   the first layer has a side surface defining the opening;
   the side surface has a first portion having a first slope;
   the side surface has a second portion coupled to the first portion having a second slope; and
   the second sloped is different from the first slope.

8. A semiconductor package comprising:
   a semiconductor device comprising a device top side, a device bottom side opposite to the device top side, a first terminal over the device bottom side, a second terminal over the device top side, and a third terminal over the device top side spaced apart from the second terminal;
   an insulating film located over the second terminal and the third terminal;
   a first layer over the insulating film and over the second terminal but not over the third terminal, wherein the first layer comprises openings extending through the first layer above the second terminal;
   a first via that extends through the insulating film to expose the third terminal;
   second vias that extend from the openings through the insulating film to expose the second terminal; and
   a second layer having a first portion within the first via and having a second portion over the first layer and within the openings and the second vias, wherein:
   the first portion of the second layer comprises a lower current wiring route for the semiconductor device; and
   the second portion of the second layer and the first layer comprise a higher current route for the semiconductor device.

9. The semiconductor package according to claim 8, wherein:
   the second portion of the second layer overlaps an upper surface of the first layer;
   the second portion of the second layer has a first thickness overlapping the upper surface of the first layer and a second thickness within the second vias; and
   the first thickness is less than the second thickness.

10. The semiconductor package according to claim 8, wherein:
    the first via is laterally spaced apart from a proximate edge of the first layer.

11. The semiconductor package according to claim 8, wherein:
    the first layer comprises a metal plate attached to the insulating layer.

12. The semiconductor package according to claim 8, wherein:
    a top surface of the insulating film has a depressed portion between each of the second vias and the respective openings.

13. The semiconductor package according to claim 8, wherein:
    the openings each have a first width; and
    the second vias each have a second width less than the first width.

14. The semiconductor package according to claim 8, wherein:
    the second portion of second layer overlaps side surfaces of the first layer in the openings.

15. A semiconductor package, comprising:
    a first semiconductor device comprising a first terminal over a bottom side of the first semiconductor device, a second terminal over a top side of the first semiconductor device, and a third terminal over the top side of the first semiconductor device spaced apart from the second terminal;

a first insulating film over the third terminal;
a first layer over the second terminal but not over the third terminal;
a first via that extends through the first insulating film to expose at least a portion of the third terminal;
a second via that extends through the first layer to expose at least a portion of the second terminal;
a second layer having a first portion within the first via and having a second portion over the first layer and within the second via, wherein:
  the first portion of the second layer comprises a first wiring route; and
  the second portion of the second layer and the first layer comprises a second wiring route;
a second semiconductor device having a fourth terminal electrically connected to the third terminal of the first semiconductor device through the first wiring route; and
a second insulating film embedding the first semiconductor device and the second semiconductor device, wherein:
  the first semiconductor device comprises a power device; and
  the second semiconductor device comprises a control device.

16. The semiconductor package according claim 15, wherein:
  the second insulating film is interposed between first layer and the second terminal and between the first insulating film and third terminal; and
  the first wiring route is devoid of the first layer.

17. The semiconductor package according to claim 15, wherein:
  the second portion of the second layer overlaps an upper surface of the first layer;
  the second portion of the second layer has a first thickness overlapping the upper surface of the first layer and a second thickness in the second via; and
  the first thickness is less than the second thickness.

18. The semiconductor package according to claim 17, wherein
  the first layer has a third thickness; and
  the first thickness is less than the third thickness.

19. The semiconductor package according to claim 15, wherein:
  the first layer comprises a patterned metal plate.

20. The semiconductor package according to claim 15, wherein: the first layer and the second layer are different in conductivity from each other.

* * * * *